United States Patent
Suzuki et al.

(10) Patent No.: US 10,545,691 B2
(45) Date of Patent: Jan. 28, 2020

(54) MEMORY SYSTEM AND METHOD OF CONTROLLING NONVOLATILE MEMORY

(71) Applicant: Toshiba Memory Corporation, Tokyo (JP)

(72) Inventors: Riki Suzuki, Yokohama (JP); Toshikatsu Hida, Yokohama (JP); Tokumasa Hara, Kawasaki (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 16/011,920

(22) Filed: Jun. 19, 2018

(65) Prior Publication Data
US 2018/0300071 A1 Oct. 18, 2018

Related U.S. Application Data

(63) Continuation of application No. 15/481,553, filed on Apr. 7, 2017, now Pat. No. 10,025,514, which is a continuation of application No. 15/296,656, filed on Oct. 18, 2016, now Pat. No. 9,652,167, which is a continuation of application No. 15/065,110, filed on Mar. 9, 2016, now Pat. No. 9,502,129.

(60) Provisional application No. 62/216,826, filed on Sep. 10, 2015.

(51) Int. Cl.
| | | |
|---|---|---|
| G11C 11/16 | (2006.01) | |
| G06F 3/06 | (2006.01) | |
| G11C 16/34 | (2006.01) | |
| G11C 16/12 | (2006.01) | |
| G11C 29/52 | (2006.01) | |
| G11C 16/04 | (2006.01) | |
| H01L 27/115 | (2017.01) | |
| H01L 27/11582 | (2017.01) | |

(52) U.S. Cl.
CPC .......... *G06F 3/0619* (2013.01); *G06F 3/0658* (2013.01); *G06F 3/0659* (2013.01); *G06F 3/0679* (2013.01); *G11C 16/12* (2013.01); *G11C 16/3431* (2013.01); *G11C 29/52* (2013.01); *G11C 11/16* (2013.01); *G11C 16/0483* (2013.01); *H01L 27/115* (2013.01); *H01L 27/11582* (2013.01)

(58) Field of Classification Search
CPC .......... G11C 11/16; G11C 11/15; H01L 43/08
USPC .................................................. 365/158, 200
See application file for complete search history.

(56) References Cited

U.S. PATENT DOCUMENTS

| | | |
|---|---|---|
| 8,462,548 B2 | 6/2013 | Aritome |
| 2007/0229230 A1 | 10/2007 | Drago |
| 2007/0258306 A1 | 11/2007 | Riekels et al. |
| 2010/0070801 A1 | 3/2010 | Cornwell et al. |
| 2012/0265927 A1 | 10/2012 | Cho et al. |

(Continued)

FOREIGN PATENT DOCUMENTS

| | | |
|---|---|---|
| JP | 2009-3843 | 1/2009 |
| JP | 2009-536423 | 10/2009 |
| WO | WO 2007/130187 A2 | 11/2007 |

*Primary Examiner* — Jason Lappas
(74) *Attorney, Agent, or Firm* — Oblon, McClelland, Maier & Neustadt, L.L.P.

(57) ABSTRACT

According to one embodiment, a controller executes first refreshing in a case where a first value of a first block is larger than a first threshold and less than a second threshold. The first refreshing includes reprogramming a plurality of second memory cells among a plurality of first memory cells included in the first block.

20 Claims, 8 Drawing Sheets

(56) References Cited

U.S. PATENT DOCUMENTS

| | | |
|---|---|---|
| 2013/0003459 A1 | 1/2013 | Ulriksson et al. |
| 2014/0119108 A1* | 5/2014 | Lee .................. G11C 29/42 |
| | | 365/158 |
| 2014/0126292 A1 | 5/2014 | Yang et al. |
| 2014/0192594 A1 | 7/2014 | Lue |

* cited by examiner

MEMORY SYSTEM AND METHOD OF CONTROLLING NONVOLATILE MEMORY

CROSS-REFERENCE TO RELATED APPLICATIONS

The present application is a continuation of U.S. application Ser. No. 15/481,553, filed on Apr. 7, 2017, which is a continuation of application Ser. No. 15/296,656, filed on Oct. 18, 2016, now U.S. Pat. No. 9,652,167, which is a continuation of application Ser. No. 15/065,110, filed on Mar. 9, 2016, now U.S. Pat. No. 9,502,129, which claims the benefit of priority from U.S. Provisional Application No. 62/216,826, filed on Sep. 10, 2015; the entire contents of all of which are incorporated herein by reference.

FIELD

Embodiments described herein relate generally to a memory system including a nonvolatile memory and a method of controlling a nonvolatile memory.

BACKGROUND

In a storage device including a semiconductor memory such as a NAND flash memory, a refreshing process for rewriting data is executed. In such a refreshing process, data stored in a block that is a movement source is moved to an erased block that is a movement destination.

DETAILED DESCRIPTION

According to one embodiment, a memory system includes a nonvolatile memory and a controller. The nonvolatile memory includes a plurality of blocks. The block includes a plurality of memory cells. In a case where a first value of a first block is larger than a first threshold and less than a second threshold, the controller executes first refreshing. The first refreshing includes reprogramming a plurality of second memory cells among a plurality of first memory cells included in the first block. The second threshold is larger than the first threshold. In a case where the first value of the first block is larger than the second threshold, the controller executes second refreshing. The second refreshing includes moving data of the first block to a second block that is different from the first block.

Exemplary embodiments of memory system and a method of controlling a nonvolatile memory will be explained below in detail with reference to the accompanying drawings. The present invention is not limited to the following embodiments.

First Embodiment

Figure 1:
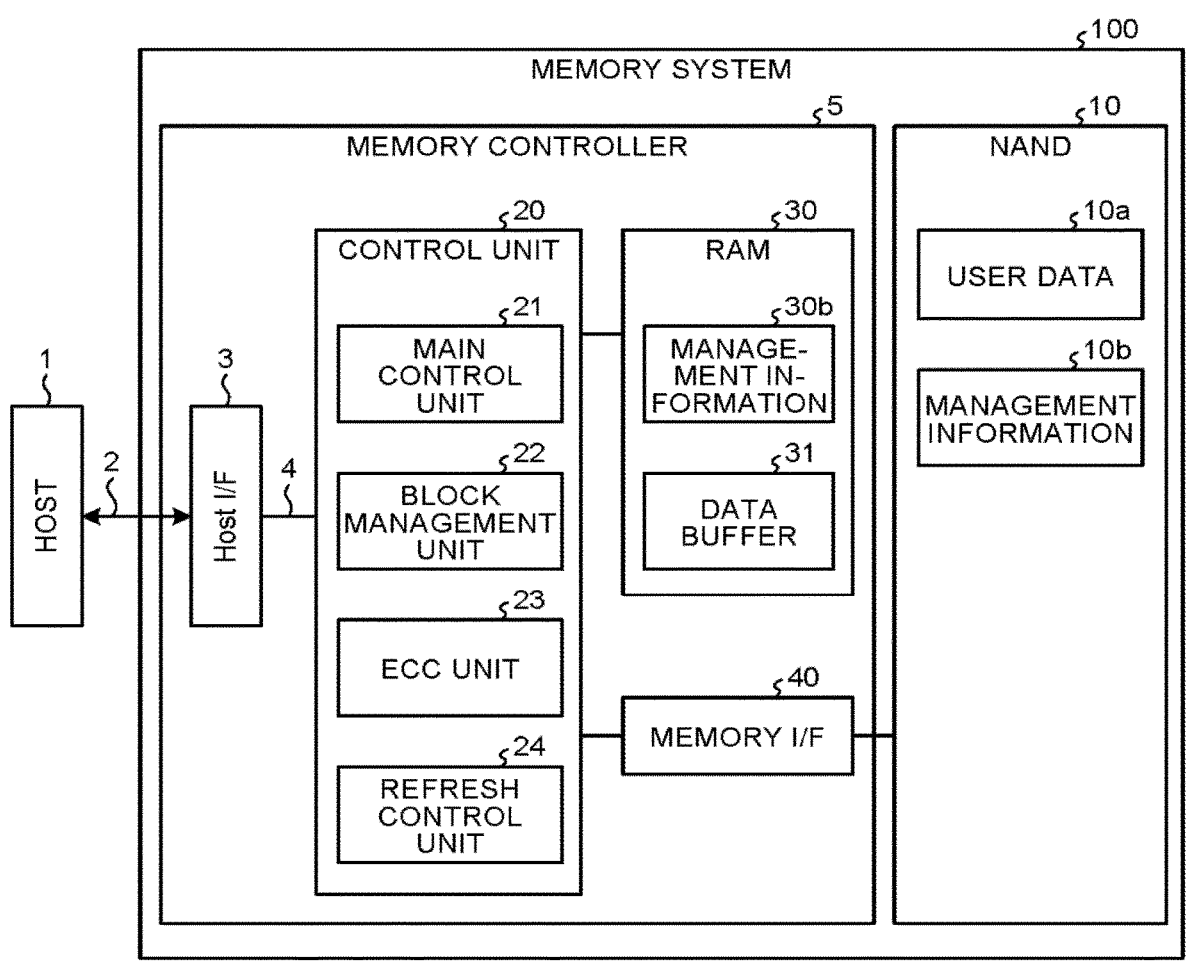
FIG. 1 is a functional block diagram that illustrates the internal configuration of a memory system.

FIG. 1 is a block diagram that illustrates an example of the configuration of a memory system 100 according to a first embodiment. The memory system 100 is connected to a host apparatus (hereinafter, abbreviated as a host) through a communication line 2 and functions as an external storage device of the host 1. The host 1, for example, may be an information processing apparatus such as a personal computer, a mobile phone, or an imaging apparatus, may be a mobile terminal such as a tablet computer or a smart phone, a gaming device, or an in-vehicle terminal such as a car navigation system.

The memory system 100 includes: a NAND flash memory (hereinafter, abbreviated as a NAND memory) 10 as a nonvolatile memory; and a memory controller 5. The nonvolatile memory device is not limited to the NAND flash memory but may be a flash memory having a three-dimensional structure, a resistance random access memory (ReRAM), a ferroelectric random access memory (FeRAM), or the like.

The NAND 10 includes one or more memory chips each including a memory cell array. The memory cell array includes a plurality of memory cells arranged in a matrix pattern. The memory cell array includes a plurality of blocks that are units for data erasing. Each block is configured by a plurality of memory cell groups MG (see FIGS. 3 and 4).

Figure 2:
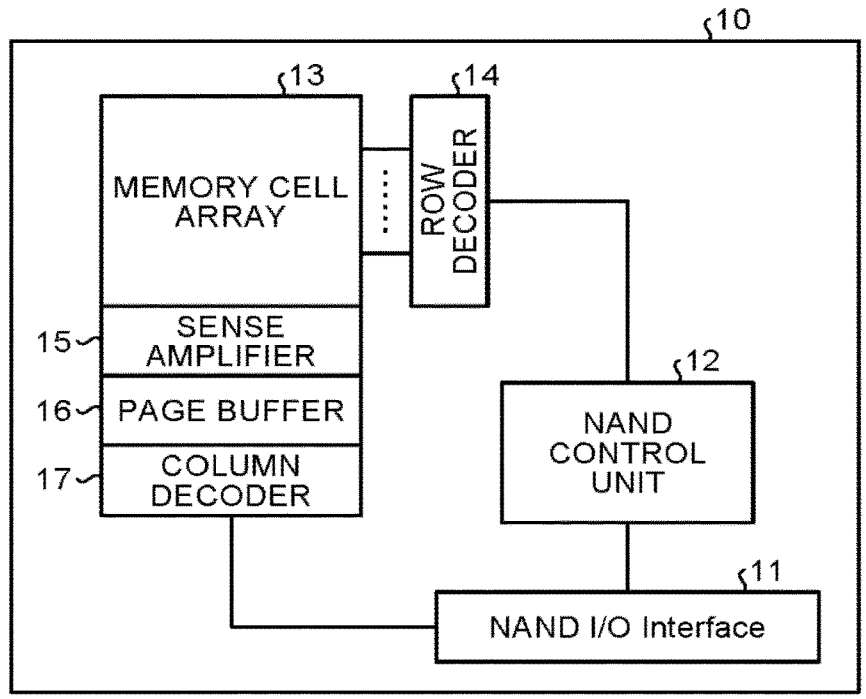
FIG. 2 is a diagram that illustrates the internal configuration of a NAND flash memory.

FIG. 2 is a diagram that illustrates an example of the internal configuration of a memory chip of the NAND 10. As illustrated in FIG. 2, the memory chip of the NAND 10 includes: a NAND I/O interface 11; a NAND control unit 12; a memory cell array (NAND memory cell array) 13; a row decoder 14; a sense amplifier 15; a page buffer 16; and a column decoder 17. The row decoder 14, the sense amplifier 15, the page buffer 16; and the column decoder 17 configure a peripheral circuit. The peripheral circuit makes an access (reading, programming, or erasing) to the memory cell array 13 under the control of the NAND control unit 12.

The NAND I/O interface 11 controls input/output of data to/from external devices such as the memory controller 5 and the like and, in a case where a command such as a write request or a read request is input, inputs the command to the NAND control unit 12. The NAND control unit 12 controls the operation of the NAND 10 based on a command or the like input from the NAND I/O interface 11. More specifically, in a case where a write request is input, the NAND control unit 12 executes control such that data requested to be written is written into a specified area of the memory cell array 13. On the other hand, in a case where a read request is input, the NAND control unit 12 executes control such that data requested to be read is read from the memory cell array 13. The data read from the memory cell array 13 is stored in the page buffer 16. The NAND control unit 12 outputs the data stored in the page buffer 16 to the memory controller 5.

Figure 3:
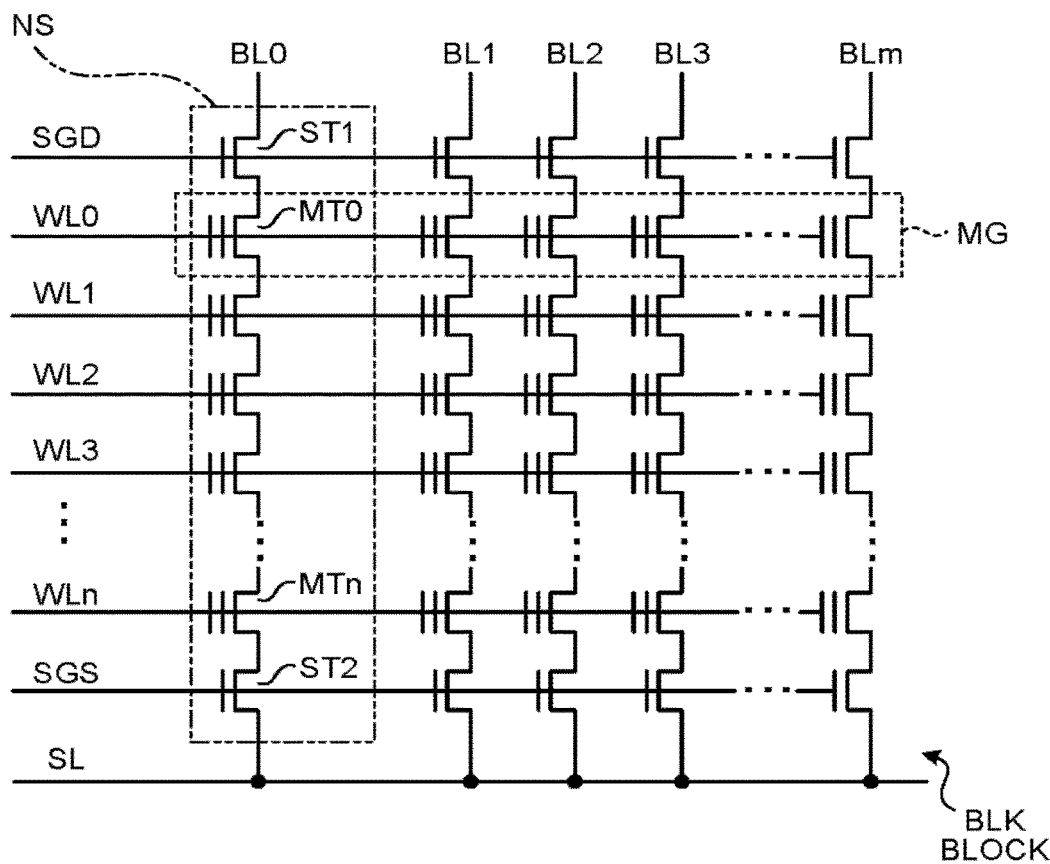
FIG. 3 is a diagram that illustrates an example of the configuration of a block of a memory cell array having a two-dimensional structure.
Figure 4:
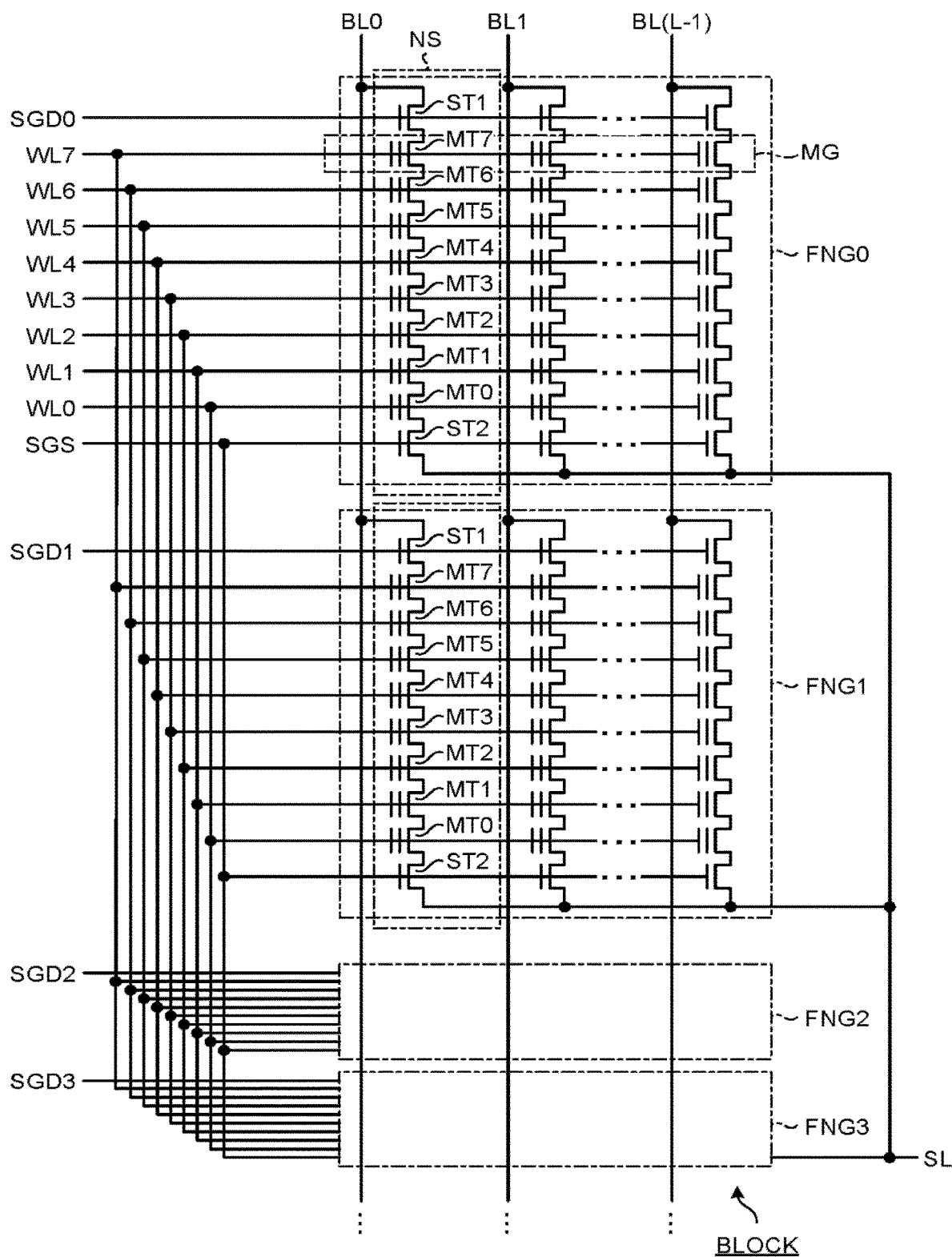
FIG. 4 is a diagram that illustrates an example of the configuration of a block of a memory cell array having a three-dimensional structure.
Figure 5:
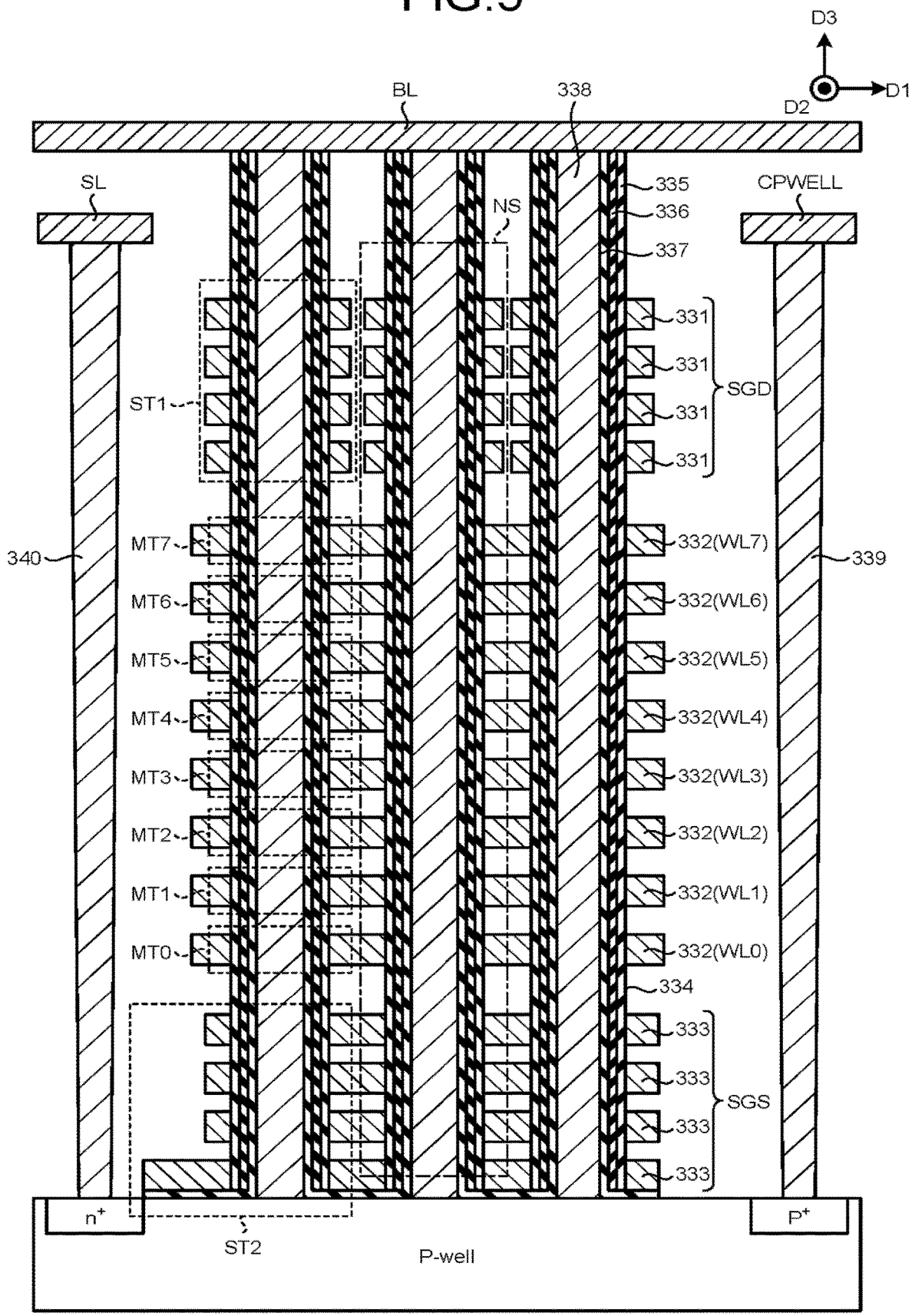
FIG. 5 is a cross-sectional view of a partial area of a memory cell array of a NAND memory having a three-dimensional structure.

The memory cell array 13 that is the premise of this embodiment is not particularly limited to a specific configuration but may be a memory cell array having a two-dimensional structure as illustrated in FIG. 3 or a memory cell array having a three-dimensional structure as illustrated in FIGS. 4 and 5 or may employ any other configuration.

FIG. 3 is a diagram that illustrates an example of the configuration of a block of the memory cell array having a two-dimensional structure. FIG. 3 illustrates one of a plurality of blocks that configure the memory cell array having the two-dimensional structure. The other blocks of the memory cell array have the same configuration as that illustrated in FIG. 3. As illustrated in FIG. 3, the block BLK of the memory cell array includes (m+1) (here, m is an integer of 0 or more) NAND strings NS. Each NAND string NS shares a diffusion region (a source region or a drain region) between memory cell transistors MT adjacent to each other. Each NAND string NS includes: (n+1) (here, n is an integer of 0 or more) memory cell transistors MT0 to MTn connected in series; and selection transistors ST1 and ST2 arranged at both ends of the column of the (n+1) memory cell transistors MT0 to MTn.

Word lines WL0 to WLn are respectively connected to control gate electrodes of the memory cell transistors MT0 to MTn that configure the NAND string NS, and, memory cell transistors MTi (here, i=0 to n) included in each NAND string NS are connected to be common using the same word line WLi (here, i=0 to n). In other words, the control gate electrodes of the memory cell transistors MTi disposed in the same row within the block BLK are connected to the same word line WLi.

Each of the memory cell transistors MT0 to MTn is configured by a field effect transistor having a stacked gate structure on a semiconductor substrate. Here, the stacked gate structure includes: a charge storage layer (floating gate electrode) formed on the semiconductor substrate with a gate insulating film being interposed therebetween; and a control gate electrode formed on the charge storage layer with an inter-gate insulating film being interposed therebetween. A threshold voltage of each of the memory cell transistors MT0 to MTn changes according to the number of electrons storable in the floating gate electrode and thus, can store data according to a difference in the threshold voltage.

Bit lines BL0 to BLm are respectively connected to the drains of (m+1) selection transistors ST1 within one block BLK, and a selection gate line SGD is connected to be common to the gates of the selection transistors. In addition, the source of the selection transistor ST1 is connected to the drain of the memory cell transistor MT0. Similarly, a source line SL is connected to be common to the sources of the (m+1) selection transistors ST2 within one block BLK, and a selection gate line SGS is connected to be common to the gates of the selection transistors. In addition, the drain of the selection transistor ST2 is connected to the source of the memory cell transistor MTn.

Each memory cell is connected not only to the word line but also to the bit line. Each memory cell can be identified by using an address used for identifying a word line and an address used for identifying a bit line. As described above, the data of the plurality of memory cells (the memory cell transistors MT) disposed within the same block BLK is erased altogether. On the other hand, data is written and read in units of memory cell groups MG. One memory cell group MG includes a plurality of memory cells connected to one word line.

Each memory cell can perform multi-value storage. In a case where the memory cells are operated in a single level cell (SLC) mode, one memory cell group MG corresponds to one page. On the other hand, in a case where the memory cells are operated in a multiple level cell (MLC) mode, one memory cell group MG corresponds to N pages (here, N is a natural number of two or more). In descriptions presented here, the term MLC mode is assumed to include a triple level cell (TLC) mode of N=3.

In a reading operation and a programming operation, one word line is selected according to the physical address, and one memory cell group MG is selected. A switching of the page within this memory cell group MG is executed using the physical address.

FIG. 4 is a diagram that illustrates an example of the configuration of a block of the memory cell array having a three-dimensional structure. FIG. 4 illustrates one block BLK among a plurality of blocks configuring the memory cell array having the three-dimensional structure. Another block of the memory cell array has a configuration similar to that illustrated in FIG. 4.

As illustrated in the drawing, the block BLK, for example, includes four fingers FNG (FNG0 to FNG3). In addition, each finger FNG includes a plurality of NAND strings NS. Each NAND string NS, for example, includes eight memory cell transistors MT (MT0 to MT7) and selection transistors ST1 and ST2. Here, the number of memory cell transistors MT is not limited to eight. The memory cell transistor MT is arranged between the selection transistors ST1 and ST2 such that the current paths thereof are connected in series. The current path of the memory cell transistor MT7 disposed on one end side of the series connection is connected to one end of the current path of the selection transistor ST1, and the current path of the memory cell transistor MT0 disposed on the other end side is connected to one end of the current path of the selection transistor ST2.

The gates of the selection transistors ST1 of the fingers FNG0 to FNG3 are commonly connected respectively to selection gate lines SGD0 to SGD3. On the other hand, the gates of the selection transistors ST2 are commonly connected to the same selection gate line SGS among a plurality of fingers FNG. In addition, the control gates of the memory cell transistors MT0 to MT7 disposed inside a same block BLK0 are commonly connected to word lines WL0 to WL7. In other words, while the word lines WL0 to WL7 and the selection gate lines SGS are commonly connected among the plurality of fingers FNG0 to FNG3 disposed inside a same block BLK, the selection gate line SGD is independent for each of the fingers FNG0 to FNG3 also inside the same block BLK.

The word lines WL0 to WL7 are connected to the control gate electrodes of the memory cell transistors MT0 to MT7 configuring the NAND string NS, and the memory cell transistors MTi (i=0 to n) of each NAND string NS are commonly connected by a same word line WLi (i=0 to n). In other words, the control gate electrodes of the memory cell transistors MTi disposed in the same row disposed inside the block BLK are connected to a same word line WLi.

Each memory cell is connected to a word line and a bit line. Each memory cell can be identified by using an address used for identifying a word line and one of selection gate lines SGD0 to SGD3 and an address used for identifying a bit line. As described above, data of memory cells (memory cell transistors MT) disposed inside a same block BLK is erased together. On the other hand, data is read and written in units of memory cell groups MG. One memory cell group MG includes a plurality of memory cells that are connected to one word line WL and belong to one finger FNG.

In a reading operation and a programming operation, one word line WL and one selection gate line SGD are selected according to the physical address, whereby a memory cell group MG is selected.

FIG. 5 is a cross-sectional view of a partial area of a memory cell array of a NAND memory having a three-dimensional structure. As illustrated in FIG. 5, a plurality of NAND strings NS are formed on a P-well region. In other words, on the P-well region, a plurality of wiring layers 333 functioning as selection gate lines SGS, a plurality of wiring layers 332 functioning as word lines WL, and a plurality of wiring layers 331 functioning as selection gate lines SGD are formed.

A memory hole 334 that arrives at the P-well region through such wiring layers 333, 332, and 331 is formed. On the side face of the memory hole 334, a block insulating film 335, a charge storage layer 336, and a gate insulating film 337 are sequentially formed, and a conductive film 338 is embedded inside the memory hole 334. The conductive film 338 functions as a current path of the NAND string NS and is an area in which a channel is formed when the memory cell transistors MT and the selection transistors ST1 and ST2 operate.

In each NAND string NS, on the P-well region, the selection transistor ST2, a plurality of the memory cell transistors MT, and the selection transistor ST1 are sequentially stacked. At the upper end of the conductive film 338, a wiring layer functioning as a bit line BL is formed.

In addition, inside the front face of the P-well region, an n+ type impurity diffusion layer and a p+ type impurity diffusion layer are formed. On the n+ type impurity diffusion layer, a contact plug 340 is formed, and a wiring layer functioning as a source line SL is formed on the contact plug 340. In addition, on the p+ type impurity diffusion layer, a contact plug 339 is formed, and a wiring layer functioning as a well wiring CPWELL is formed on the contact plug 339.

A plurality of the configurations illustrated in FIG. 5 are arranged in a depth direction of the paper face of FIG. 5, and one finger FNG is formed by a set of a plurality of NAND strings aligned in one line in the depth direction.

Referring back to FIG. 1, the configuration of the memory system 100 will be described. In the NAND 10, user data 10a transmitted from the host 1, management information 10b of the memory system 100, firmware (not illustrated in the drawing), and the like are stored. The firmware operates a CPU (not illustrated in the drawing) that realizes at least a part of the function of the control unit 20 of the memory controller 5. The firmware may be stored in a ROM not illustrated in the drawing. The management information 10b includes a logical/physical translation table, a block management table, and the like.

The memory controller 5 includes: a host interface 3; a memory interface 40; a RAM 30; and a control unit 20. In this embodiment, while the RAM 30 is provided inside the memory controller 5, the RAM 30 may be provided outside the memory controller 5. The host I/F 3 outputs a command, user data (write data), and the like received from the host 1 to an internal bus 4. In addition, the host I/F 3 transmits the user data read from the NAND 10, a response from the control unit 20, and the like to the host 1. The memory I/F 40 directly controls the NAND 10 based on a instruction from the control unit 20.

The RAM 30 is a volatile semiconductor memory that can be accessed at a higher speed than the NAND 10. The RAM 30 includes a storage area as a data buffer 31. Data received from the host 1 is temporarily stored in the data buffer 31 before being written into the NAND 10. Data read from the NAND 10 is temporarily stored in the data buffer 31 before being transmitted to the host 1. The management information 10b stored in the NAND 10 is loaded into the RAM 30. The management information 30b loaded into the RAM 30 is backed up into the NAND 10. The RAM 30 also functions as a buffer in which the firmware stored in the NAND 10 is loaded. As the RAM 30, a static random access memory (SRAM) or a dynamic random access memory (DRAM) is used.

The control unit 20 includes: a main control unit 21; a block management unit 22, an ECC unit 23; and a refresh control unit 24. The function of the control unit 20 is realized by one or a plurality of CPUs (processors) executing firmware loaded in the RAM 30 and peripheral circuits thereof. The function of the main control unit 21 is realized by a CPU and/or hardware that execute firmware. The function of the block management unit 22 is realized by a CPU and/or hardware that execute firmware. The function of the ECC unit 23 is realized by a CPU and/or hardware that execute firmware. The function of the refresh control unit 24 is realized by a CPU and/or hardware that execute firmware.

The main control unit 21 executes a process corresponding to a command received from the host 1 and the like. For example, in a case where a write request is received from the host 1, the main control unit 21 temporarily stores write data in the data buffer 31. When the data buffer 31 is full, for example, the main control unit 21 reads write data stored in the data buffer and writes the read write data into the NAND 10 through the ECC unit 23 and the memory I/F 40.

On the other hand, in a case where a read request is received from the host 1, the main control unit 21 instructs the memory I/F 40 to read data from the NAND 10. The memory I/F 40 temporarily stores the data read from the NAND 10 in the data buffer 31 through the ECC unit 23. The main control unit 21 transmits the read data stored in the data buffer 31 to the host 1 through the host I/F 3.

The main control unit 21 manages the user data by using a logical/physical translation table that is one of the management information 30b that is loaded into the RAM 30. In the logical/physical translation table, mapping associating a logical address used by the host 1 with the physical address of the NAND 10 is registered. As the logical address, for example, logical block addressing (LBA) is used. The physical address represents a storage position on the NAND 10 at which the data is stored.

The block management unit 22 executes the management of blocks included in the NAND 10 by using the block management table that is one of the management information 30b loaded in the RAM 30. In the block management table, for example, the following block management information is managed.

The number of times of erasing in units of blocks

Information representing whether a block is an active block or a free block

Block address of a bad block

An active block is a block in which valid data is recorded. A free block is a block in which valid data has not been recorded and is reusable after erasing the data. The valid data is data associated with a logical address, and invalid data is data not associated with a logical address. When data is written into a free block after erasing data stored therein, the free block becomes an active block. A bad block is an unusable block that does not normally operate due to various factors.

The ECC unit 23 executes an error correction coding process for data transmitted from the data buffer 31, thereby generating parity. The ECC unit 23 outputs a code word including data and parity to the memory I/F 40. The memory I/F 40 inputs the code word read from the NAND 10 to the ECC unit 23. The ECC unit 23 executes an error correction decoding process by using the input code word and transmits decoded data to the data buffer 31.

As a coding system executed by the ECC unit 23, any system may be used. For example, Reed Solomon (RS) coding, Bose Chaudhuri Hocquenghem (BCH) coding, low density parity check (LDPC) coding, or the like may be used. The ECC unit 23 has a function for reporting the degree of error detected in a decoding process to the main control unit 21. The degree of error, for example, is the number of error bits, an error bit ratio, or the number of times of executing error correction.

The number of error bits, for example, is the number error bits included in data of a certain unit. The error bit ratio, for example, is a ratio of error bits included in data of a certain unit. The number of times of executing error correction is the number of times of executing the error correction process until the error correction is successful. The ECC unit 23 includes a first-level ECC unit and a second-level ECC unit that are at least two ECC processing units having mutually-different error correction capabilities. The error correction capability of the second-level ECC unit is higher than that of the first-level ECC unit. The error correction capability, for example, can be changed by changing the data size configuring a code word and/or the coding system. In a case where an error correction fails in the first-level ECC unit, an error correction is made by the second-level ECC unit. The ECC unit 23 reports one as the number of times of executing error correction in a case where an error correction is successful in the first-level ECC unit and reports two as the number of times of executing error correction in a case where an error correction is successful in the second-level ECC unit.

Figure 6:
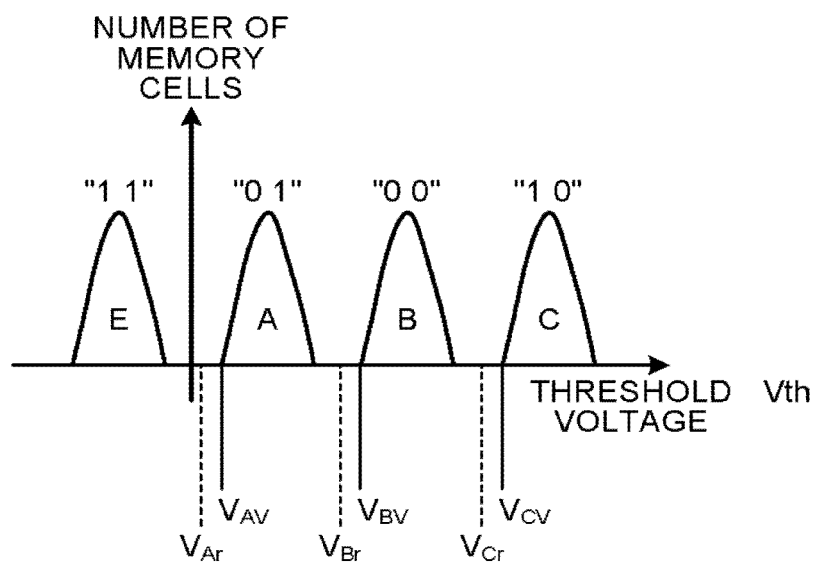
FIG. 6 is a diagram that illustrates distributions of threshold voltages in a four-value data storage system.

FIG. 6 illustrates a distribution of threshold voltages relating to four-value data (data "11", "01", "00", and "11") stored in a memory cell of a four-value NAND cell (2-bit cell) flash memory. The horizontal axis represents the threshold voltage. The vertical axis represents the number of memory cells. Here, when data is denoted as "xy", x represents upper-page data and y represents lower-page data. In description presented hereinafter, a mountain of a distribution disposed on the left side on which the threshold voltage is low toward a mountain of a distribution disposed on the right side on which the threshold voltage is high in FIG. 6 will be referred to as mountains E, A, B, and C. In the case illustrated in FIG. 6, the threshold distribution of the data "11" corresponds to the mountain E, the threshold distribution of the data "01" corresponds to the mountain A, the threshold distribution of the data "00" corresponds to the mountain B, and the threshold distribution of the data "10" corresponds to the mountain C. The correspondence between each mountain and the four-value data is arbitrary, and, for example, the mountain E, the mountain A, the mountain B, and the mountain C may be respectively in correspondence with the data "11", "10", "00", and "01".

Next, a programming process of four-value data in the NAND 10 will be described. The mountain E corresponds to the threshold distribution of the memory cell after block erasing, and the data "11" is assigned thereto. In accordance with the value of the lower page data, in other words, a programming voltage Vprg is applied to a selected word line connected to a memory cell of which the value of the lower page data is "0", and, for example, 0 V is applied to a selected bit line connected to the same memory cell. More specifically, the sense amplifier 15 sets the electric potential of a bit line selected by the column decoder 17 to 0 V. The row decoder 14 applies the programming voltage (programming pulse) Vprg to the selected word line. Then, the threshold voltage of the floating gate of a memory cell located at an intersection of the selected bit line and the selected word line rises. The sense amplifier 15 checks whether or not the threshold voltage arrives at a verify voltage according to data stored in the page buffer 16 every time when the programming pulse is applied. Until the threshold voltage arrives at the verify voltage according to the data, the sense amplifier 15 continues to apply the programming pulse to the row decoder 14. In this way, the programming operation is repeated until the threshold voltage of the memory cell of which the value of the lower page data is "0" becomes a certain verify voltage or higher.

Thereafter, for a memory cell of the data "11", a rise in the threshold voltage Vth of the memory cell is prevented, whereby application of a high voltage to the memory cell is prevented. For example, for the memory cell of the data "11", when a programming operation is executed for memory cells of the other data "01", "00", and "10", a write inhibition voltage Vdd is applied to a bit line connected to the memory cell of the data "11" is applied, whereby the selection transistor ST1 is Off.

For a memory cell of the data "01", a certain verify electric potential VAV is set, and the programming operation is repeated until the threshold voltage of the memory cell becomes the verify voltage VAV or higher.

For a memory cell of data "00", a certain verify electric potential VBV is set, and the programming operation is repeated until the threshold voltage of the memory cell becomes the verify voltage VBV or higher. For a memory cell of data "10", a certain verify electric potential VCV is set, and the programming operation is repeated until the threshold voltage of the memory cell becomes the verify voltage VCV or higher. Also in a multi-bit storage system of three or more bits, only an operation of dividing the threshold voltage distribution into eight or more kinds according to data of the upper page is further added, and thus, the basic operation is similar to that described above.

Next, a process of reading four-value data in the NAND 10 will be described. At the time of reading data, the sense amplifier 15 pre-charges a bit line BL with power source electric potential Vcc, and the row decoder 14 sequentially applies read voltages VAr, VBr, VCr set between mountains to selected word lines WL. In addition, the row decoder 14 applies transmission electric potential to word lines WL that are not selected and sets memory cells belonging to the word lines WL that are not selected to be in a conductive state. The sense amplifier 15 determines data stored in a target memory cell by detecting whether electric charge accumulated through the pre-charging process flows out to a source line SL when a certain read electric potential is applied.

For example, as illustrated in FIG. 6, the read voltage VAr is set between the mountain E and the mountain A, the read voltage VBr is set between the mountain A and the mountain B, and the read voltage VCr is set between the mountain B and the mountain C.

In a case where the reading target is a lower page, the read voltage VBr is used for the determination. When a current is detected at the source line SL in a case where the read voltage VBr is applied, the sense amplifier 15 determines that data "1" is stored in the target memory cell. On the other hand, when a current is not detected at the source line SL in a case where the read voltage VBr is applied, the sense amplifier 15 determines that data "0" is stored in the target memory cell.

In a case where the reading target is an upper page, the read voltage VAr and the read voltage VCr are used for the determination. When a current is detected in a case where the read voltage VAr is applied, or when a current is not detected in a case where any one of the read voltage VAr and the read voltage VCr is applied, the sense amplifier 15 determines that data "1" is stored in the target memory cell. On the other hand, when a current is not detected in a case where the read voltage VAr is applied, and a current is detected in a case where the read voltage VCr is applied, the sense amplifier 15 determines that data "0" is stored in the target memory cell.

Meanwhile, in the NAND 10, there are error factors such as a data retention error, a reading disturbing error, and a programming disturbing defect. According to such error factors, the amount of electric charge in the floating gate changes. As a result, the threshold distributions of the memory cells change as denoted by broken lines in FIG. 7. When the distributions change as such, for the set read voltages VAr, VBr, and VCr, the number of cells of which data cannot be correctly identified increases. Hereinafter, a memory cell of which the threshold voltage is out of an allowed range due to the error factors described above and of which data cannot be correctly identified will be referred to as an error cell. Memory cells of which the threshold voltage are out of the allowed range, for example, are a memory cell having a threshold voltage lower than the read voltage VCr among memory cells in which data "10" is written, a memory cell having a threshold voltage lower than the read voltage VBr among memory cells in which data "00" is written, and a memory cell having a threshold voltage lower than the read voltage VAr among memory cells in which data "01" is written.

The number of such error cells increases according to an elapse of time as the whole NAND 10. While the number of error cells is small, data can be restored by an error correction process executed by the ECC unit 23. However, when the number of error cells increases to some degree or more, in the decoding process executed by the ECC unit 23, write data cannot be restored. When the error correction cannot be made by the ECC unit 23, the memory system 100 loses the write data.

For this reason, in the memory system 100, for example, by executing a refreshing process in which data stored in a block, of which the number of error bits exceeds a certain threshold in the error correction process executed by the ECC unit 23, is written into another block, the number of error bits of each block occurring in the error correction process is suppressed to be a constant number or less. Hereinafter, refreshing for rewriting data of a refreshing source block into a refreshing destination block will be referred to as normal refreshing. However, this normal refreshing process accompanies an erasing process, and, accordingly, when the normal refreshing process is repeated several times, damage given to the NAND 10 is accumulated.

Thus, in the embodiment, in addition to the normal refreshing described above, overwrite refreshing is executed. In the overwrite refreshing, the error cell is specified, and the same data is overwritten into the specified error cell, in other words, reprogramming is executed. The error cell may be specified by either the NAND control unit 12 of the NAND 10 or the control unit 20 of the memory controller 5. In a case where the error cell is specified by the control unit 20, there is a method using the error correction process executed by the ECC unit 23 or distribution reading. The method of specifying the error cell will be described later. The overwrite refreshing is executed in a certain processing unit (for example, in units of blocks, in units of memory cell groups, or in units of pages). In the overwrite refreshing, since the overwrite refreshing is executed by only a programming process, damage in the NAND 10 is less than that of the normal refreshing by an amount corresponding to no accompaniment of an erasing process. For this reason, compared to a technique executing only the normal refreshing, the life of the NAND 10 can be lengthened. Particularly, in a situation in which the overwriting amount of refreshing is dominant, the damage given to the NAND 10 in the refreshing process can be decreased. In addition, in the overwrite refreshing, only a programming operation is executed without accompanying an erasing process, and thus, the number of times of programing is less than that of the normal refreshing, and accordingly, compared to the normal refreshing, the refreshing can be executed with low power consumption and at high speed.

In FIG. 1, the refresh control unit 24 executes the normal refreshing and the overwrite refreshing. The normal refreshing is executed when a normal refreshing execution condition is satisfied. The overwrite refreshing is executed when an overwrite refreshing execution condition is satisfied. While the overwrite refreshing, as described above, can be executed in a page unit, a memory cell group unit, or a block unit, here, a case will be described in which the overwrite refreshing is executed in units of blocks.

The refresh control unit 24 manages a parameter used for determining whether or not normal refreshing is executed and a parameter used for determining whether or not overwrite refreshing is executed. The parameter used for determining whether or not normal refreshing is executed and the parameter used for determining whether or not overwrite refreshing is executed may be different from each other or may be the same. Hereinafter, the parameter used for determining whether or not normal refreshing is executed and the parameter used for determining whether or not overwrite refreshing is executed will be collectively referred to as refreshing parameters. As the refreshing parameters, for example, numerical values representing the degrees of error of a block such as the number of error bits of the block, an error bit rate of the block, and the number of times of executing the error correction of the block are used. In addition, as the refreshing parameter, the number of times of executing erasing data of a block, the number of times of reading data of a block, or the number of times of writing data into the block is used. Furthermore, as the refreshing parameter, a time interval or time for refreshing is used. The refresh control unit 24 can designate a time interval or time for refreshing. In addition, as the refreshing parameter for the normal refreshing, the number of times of executing the overwrite refreshing for a block can be used.

A case will be described in which the number of error bits of a block is used as the refreshing parameter. The number of error bits of a block is calculated based on the number of error bits of one or a plurality of pages included in the block. The number of error bits of a page is the number of error bits occurring in data written into the page and is notified from the ECC unit 23. In order to calculate the number of error bits of a block, the number of error bits of all the pages included in the block may be acquired. In addition, the number of error bits of a block may be calculated based on the number of error bits of specified one or a plurality of pages selected in advance as sample targets. For example, the numbers of error bits of a plurality of pages that are sample targets are acquired, and an average value or a maximum value thereof is set as the number of error bits of the block.

A case will be described in which the number of times of reading data of a block is used as the refreshing parameter. The number of times of reading data of a block is calculated based on the number of times of reading data of one or a plurality of pages included in the block. In order to calculate the number of times of reading data of a block, the number of times of reading all the pages included in the block may be acquired. In addition, the number of times of reading data of a block may be calculated based on the number of times of reading specified one or a plurality of pages selected in advance as sample targets. For example, the numbers of times of reading data of a plurality of pages that are sample targets are acquired, and an average value or a maximum value thereof is set as the number of times of reading data of the block.

Figure 8:
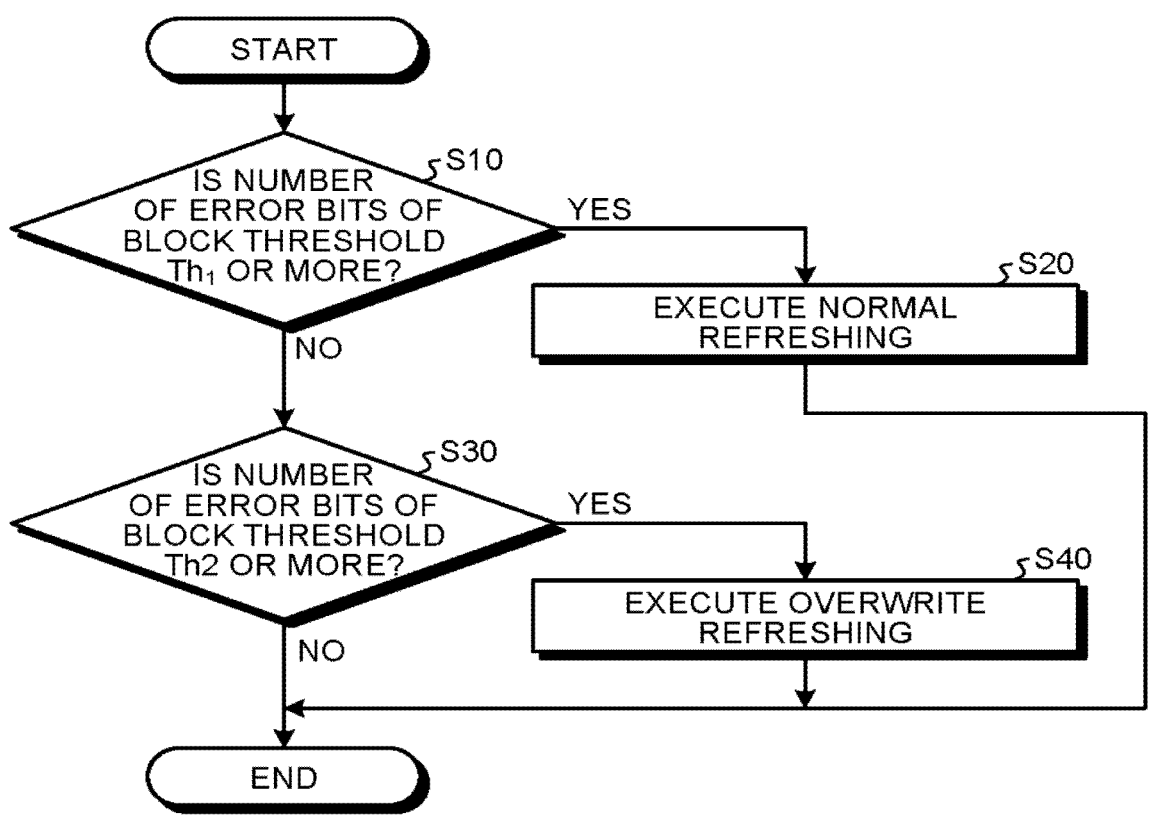
FIG. 8 is a flowchart that illustrates a refreshing process.

FIG. 8 is a flowchart that illustrates the refreshing process executed by the refresh control unit 24. In the case illustrated in FIG. 8, as the parameter used for determining whether or not the normal refreshing and the overwrite refreshing are executed, the number of error bits of the block is used. The refresh control unit 24 calculates the number of error bits of a block based on information notified from the ECC unit 23 at the time of executing a reading process or patrol reading based on a read command transmitted from the host 1. The patrol reading is a process in which data stored in the NAND 10 is read for each certain unit, and the read data is tested based on a result of the error correction executed by the ECC unit 23 for detecting a block in which the number of errors increases. In this test process, the number of error bits of read data is compared with a threshold, and data of which the number of error bits exceeds the threshold is set as a refreshing target. For example, when error correction cannot be executed by the first-level ECC unit, the data is set as a refreshing target. In the patrol reading, during one certain cycle determined in advance, data is read from all the area of the NAND 10 and is tested.

The refresh control unit 24 compares the calculated number of error bits of the block with a threshold Th1 (Step S10) and, in a case where the number of error bits is the threshold Th1 or more (Step S10: Yes), executes normal refreshing for this block (Step S20). In other words, data stored in the block is moved to another erased block. The refresh control unit 24 compares the number of error bits with a threshold Th2 less than the threshold Th1 (Step S30) in a case where the number of error bits is less than the threshold Th1 (Step S10: No) and executes the overwrite refreshing for the block (Step S40) in a case where the number of error bits is the threshold Th2 or more (Step S10: Yes). In a case where the number of error bits is less than the threshold Th2 (Step S30: No), refreshing is not executed for the block.

The refreshing process that is executed by the refresh control unit 24 does not need to follow the exact same procedures as the steps illustrated in FIG. 8, as long as: (1) an overwrite refreshing is executed for a block in a case where the calculated number of error bits of that block is equal to or greater than the threshold Th2 and less than the threshold Th1; and (2) a normal refreshing is executed for a block in a case where the number of error bits is equal to or greater than the threshold Th1.

Figure 9:
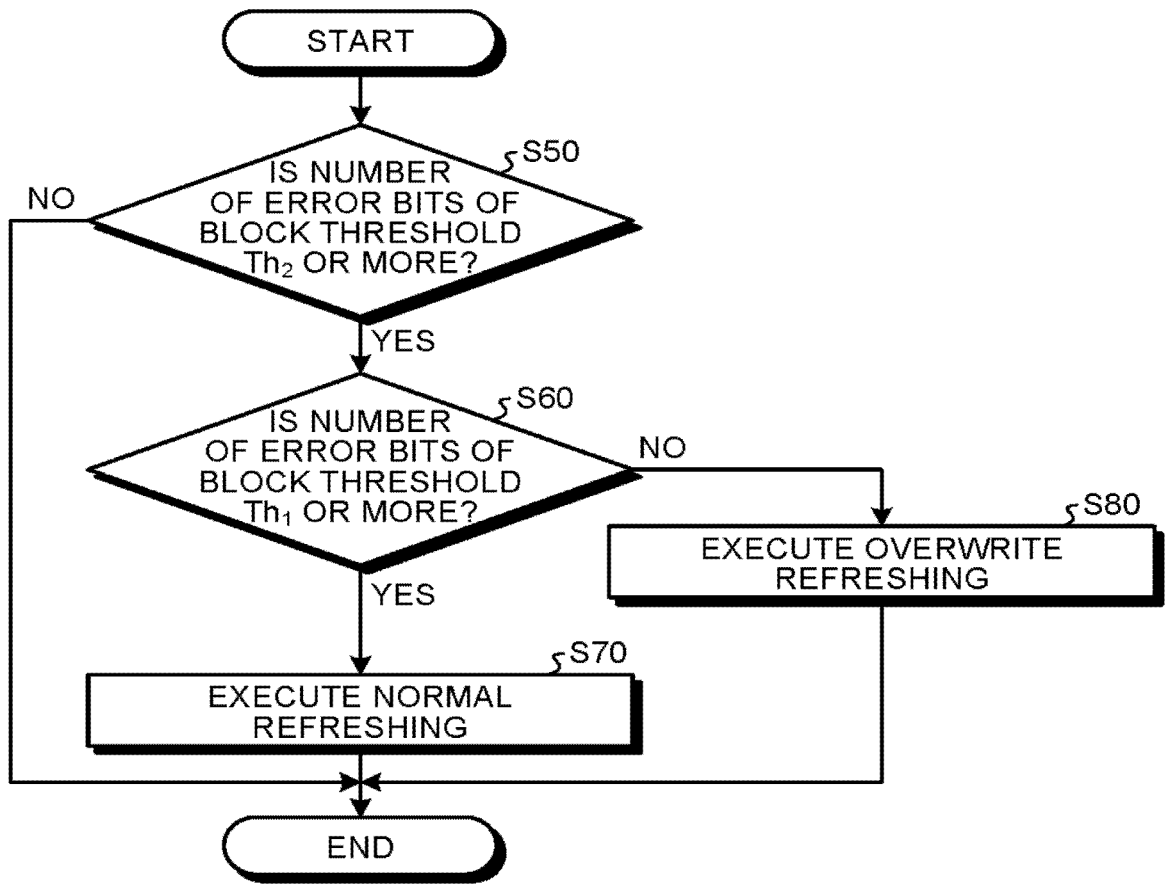
FIG. 9 is a flowchart that illustrates another example of the refreshing process.

FIG. 9 is a flowchart that illustrates another example of the refreshing process executed by the refresh control unit 24. The refreshing process shown in FIG. 9 is a variation of the refreshing process shown in FIG. 8. The refresh control unit 24 compares the calculated number of error bits of the block with the threshold Th2 (Step S50) and, in a case where the number of error bits is less than the threshold Th1 (Step S50: No), refreshing is not executed for the block. In a case where the number of error bits is equal to or more than the threshold Th2 (Step S50: Yes), the refresh control unit 24 compares the number of error bits with the threshold Th1 that is more than the threshold Th2 (Step S60). In a case where the number of error bits is equal to or more than the threshold Th1 (Step S60: Yes), the refresh control unit 24 executes the normal refreshing for this block (Step S70). In a case where the number of error bits is less than the threshold Th1 (Step S60: No), the refresh control unit 24 executes the overwrite refreshing for the block (Step S80).

Figure 10:
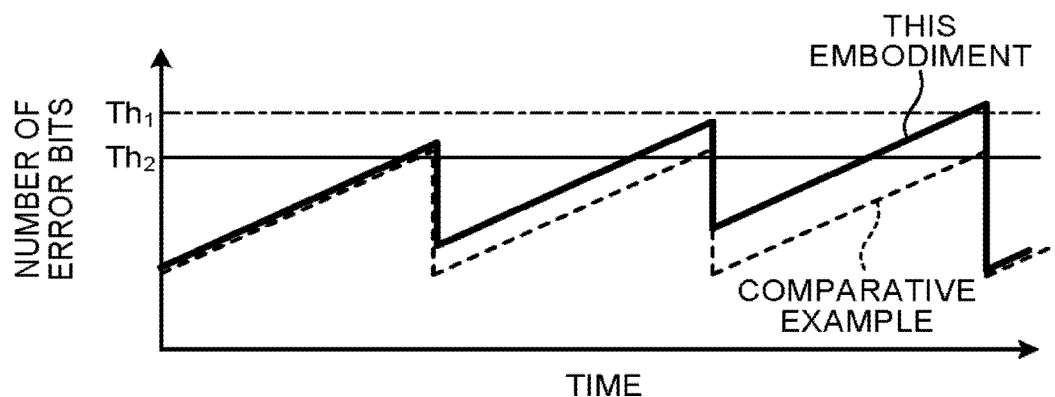
FIG. 10 is a diagram that illustrates a change in the number of error bits with respect to time in a case where refreshing is executed using a technique according to an embodiment and a change in the number of error bits with respect to time in a case where refreshing is executed using a technique of a comparative example.

FIG. 10 is a diagram that illustrates a relation between a change in the number of error bits of a certain block and a refreshing process. A solid line represents a change in the number of error bits of a case where a technique according to this embodiment is used. A broken line represents a change in the number of error bits of a case where a technique according to a comparative example is used. In a memory system of the comparative example, only the normal refreshing is executed. In the memory system of the comparative example, the normal refreshing is executed when the number of error bits is the threshold Th2 or more. In contrast to this, the memory system according to this embodiment executes the overwrite refreshing when the number of error bits is the threshold Th2 or more and less than the threshold Th1 and executes the normal refreshing when the number of error bits is the threshold Th1. In the case illustrated in FIG. 10, the memory system of the comparative example executes the normal refreshing three times. In this embodiment, the overwrite refreshing is executed twice, and the normal refreshing is executed once, and thus, the number of times of executing the normal refreshing is decreased.

In a case where the overwrite refreshing is executed in units of memory cell groups described above, the refresh control unit 24 calculates the refreshing parameter in units of memory cell groups and, when the calculated value exceeds a threshold used for the overwrite refreshing, executes the overwrite refreshing in units of memory cell groups. On the other hand, in a case where the overwrite refreshing is executed in units of pages, the refresh control unit 24 calculates the refreshing parameter in units of pages and, when the calculated value exceeds the threshold used for the overwrite refreshing, executes the overwrite refreshing in units of pages.

Next, the overwrite refreshing will be described in detail. When the overwrite refreshing is executed, there are a first case in which the NAND 10 has an overwrite refreshing function and a second case in which the NAND 10 does not have an overwrite refreshing function. The operation of the refresh control unit 24 is different between the first case and the second case.

First, the first case will be described. In a case where the condition (the number of error bits is the threshold Th2 or more) of Step S30 illustrated in FIG. 8 is satisfied, the refresh control unit 24 outputs an overwrite refreshing command to the NAND 10 through the memory I/F 40 in order to execute the overwrite refreshing of a block for which the condition is satisfied. The overwrite refreshing command includes: a command XXh formed by an arbitrary code representing overwrite refreshing; an address ADD of the block for which the condition of Step S30 is satisfied, and data DD stored in the block. The data stored in the block is data of all the pages included in the block and is a code word for which the error correction is executed by the ECC unit 23.

Figure 11:
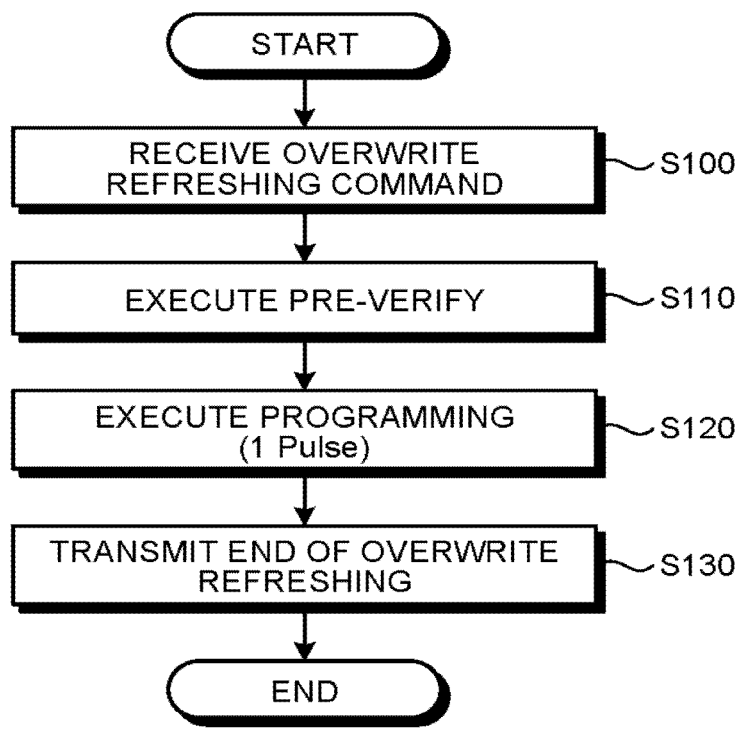
FIG. 11 is a flowchart that illustrates an example of an overwrite refreshing process.

FIG. 11 is a flowchart that illustrates an example of the process executed by the NAND control unit 12 of the NAND 10. The NAND control unit 12 of the NAND 10 receives an overwrite refreshing command transmitted from the memory I/F 40 through the NAND I/O interface 11 (S100). The NAND control unit 12 recognizes the execution of overwrite refreshing based on the command XXh included in the received overwrite refreshing command and specifies a target area for which the overwrite refreshing is executed based on the address ADD of the block.

The NAND control unit 12 executes a pre-verify process for the specified target area (Step S110). The pre-verify process is a process in which an error cell inside a specified area is specified. The NAND control unit 12 executes the pre-verify process, thereby specifying one or a plurality of error cells inside the specified target area.

Next, the NAND control unit 12 executes the overwrite refreshing in which reprogramming is executed for the specified error cell, and reprogramming is not executed for normal cells that are cells other than the error cell inside the block based on the received data DD (Step S120). For example, in the case of the four-value memory cell illustrated in FIG. 7, to an error cell belonging to the mountain A, word line electric potential used for the mountain A is set, verify electric potential VAV used for the mountain A is set, and the programming operation is executed. In this programming operation, a voltage corresponding to one pulse or several pulses is applied to a memory cell. A voltage is not applied to normal cells belonging to the mountain A. Also for memory cells belonging to the mountain B and the mountain C, a similar reprogramming operation is executed. In this way, only error cells are reprogrammed, and the threshold voltage of the error cells can be raised to be in an allowed range. When such overwrite refreshing ends, the NAND control unit 12 transmits the end of the overwrite refreshing to the refresh control unit 24 of the memory controller 5 (Step S130).

Figure 12:
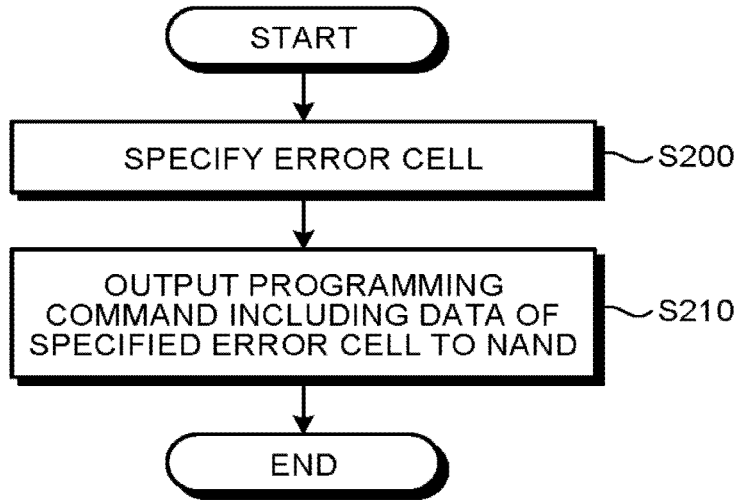
FIG. 12 is a flowchart that illustrates another example of the overwrite refreshing process.

Next, the second case will be described. FIG. 12 is a flowchart that illustrates an example of the operation of the memory controller 5 that is executed in case of the second case. In a case where the condition (the number of error bits is the threshold Th2 or more) of Step S30 illustrated in FIG. 8 is satisfied, the refresh control unit 24 specifies an error cell for which the condition is satisfied inside the block (Step S200). As a process for the specifying of an error cell, for example, first and second methods may be used. The first method is a method using an error correction process, and an error cell corresponding to error bit data is specified, for example, using a BCH code. The second technique is a method using distribution reading. In a distribution reading operation, for example, while a plurality of kinds of read voltages are sequentially applied to a selected word line, a threshold voltage is determined for each of a plurality of memory cells connected to the word line, and results of the determinations are counted, whereby a threshold distribution of memory cells is acquired. Thus, according to the distribution reading, an error cell of which the threshold distribution is out of the allowed range can be specified.

Next, the refresh control unit 24 outputs a programming command including a normal programming command to the NAND 10 so as to execute overwrite refreshing of a block for which the condition of Step S30 illustrated in FIG. 8 is satisfied (S210). This programming command, in addition to a normal programming command, includes an address and data used for reprogramming an error cell inside a target block and used for not reprogramming normal cells inside the target block. Error correction is executed by the ECC unit 23 for the data used for reprogramming an error cell. Data used for not reprogramming a normal cell, for example, is data ("11" in the case illustrated in FIG. 6) corresponding to an erase level (the mountain E illustrated in FIG. 6).

When the programming command is received, the NAND control unit 12 of the NAND 10 executes a programming process such that reprogramming is executed for an error cell inside the block, and reprogramming is not executed for the other normal cells inside the block based on the data and the address that have been received. In this way, only the error cell is reprogrammed, and the threshold voltage of the error cell can be raised to be within an allowed range. In addition, at the time of reprogramming the error cell, an electric field corresponding to one pulse or several pulses is preferably applied to the memory cell.

In the description presented above, while the overwrite refreshing is executed in units of blocks, the overwrite refreshing may be executed in units of memory cell groups or in unit of pages.

In this way, according to the first embodiment, since the normal refreshing and the overwrite refreshing are used together, the number of times of executing the normal refreshing accompanying an erasing operation can be decreased, and damage given to the NAND is decreased, whereby the life of the NAND can be lengthened. Particularly, for a NAND having a three-dimensional structure, in a case where the Yupin effect is small, a sufficient effect can be expected also in the overwrite refreshing.

Second Embodiment

Figure 7:
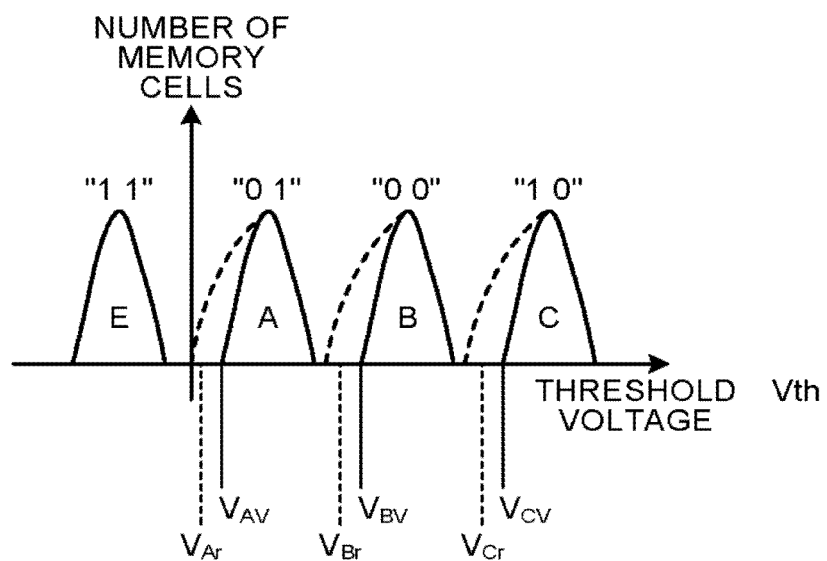
FIG. 7 is a diagram that illustrates a distribution of threshold voltages that is changed due to various error factors.

According to a second embodiment, for each of a plurality of mountains configuring a threshold distribution, a correction amount for a threshold voltage at the time of overwrite refreshing is configured to be changeable. As illustrated in FIG. 7, in the case of the four-value memory cell, there are four mountains (mountains E, A, B, and C). The tendency of a change (corresponding to a broken line illustrated in FIG. 7) in the distribution of each mountain that is caused by a data retention error, a reading disturbing error, a programming disturbing defect, and the like is acquired through experiments. For example, it is assumed that the amount of change of the mountain C>the amount of change of the mountain B>the amount of change of the mountain A. In such a case, the overwrite refreshing is executed by using correction amounts satisfying a relation of "the correction amount of the threshold voltage of the memory cell belonging to the mountain C>the correction amount of the threshold voltage of the memory cell belonging to the mountain B>the correction amount of the threshold voltage of the memory cell belonging to the mountain A". For example, a tendency of the change in the distribution of each mountain accompanied with a change in the number of times of reading data (or the number of times of erasing data) is acquired through experiments, and a correction amount for the threshold voltage of each mountain according to the number of times of reading data (or the number of times of erasing data) is set. Then, when the overwrite refreshing is executed, a mountain to which the memory cell that is an overwrite refreshing target belongs and the number of times of reading data of the memory cell that is the overwrite refreshing target are acquired, and a correction amount corresponding to the mountain and the number of times of reading data that have been acquired is used.

In this way, according to the second embodiment, the overwrite refreshing is executed by using the first correction amount when the memory cell is programmed using the threshold voltage belonging to the mountain A, the overwrite refreshing is executed by using the second correction amount when the memory cell is programmed using the threshold voltage belonging to the mountain B, and the overwrite refreshing is executed by using the third correction amount when the memory cell is programmed using the threshold voltage belonging to the mountain C, whereby an error cell can be restored into a normal cell with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory including a plurality of memory cells, each of the memory cells being configured to be programmed to store data in accordance with a threshold voltage, and
   a controller circuit configured to:
   upon a threshold voltage used in a successful programming of a successfully programmed memory cell being less than a previous threshold voltage, control the nonvolatile memory to perform first refreshing, the first refreshing including raising the threshold voltage of the successfully programmed memory cell.

2. The memory system according to claim 1, wherein raising the threshold voltage is achieved by re-programming the successfully programmed memory cell.

3. The memory system according to claim 1, wherein re-programming the successfully programmed memory cell is performed without erasing data from the successfully programmed memory cell.

4. The memory system according to claim 1, wherein
   the nonvolatile memory includes a plurality of word lines including a first word line and a second word line, each of the word lines connecting at least one memory cell among the plurality of memory cells,
   the nonvolatile memory includes a block, the block being a unit for erasing of data and including the first word line and the second word line, and
   the first refreshing is performed on the first word line and not performed on the second word line.

5. The memory system according to claim 4, wherein the first refreshing is performed on not all of the memory cells connected to the first word line.

6. The memory system according to claim 1, wherein
   the successfully programmed memory cell has been verified to have a first threshold voltage at being successfully programmed, and
   the first refreshing does not include a verify process to verify the successfully programmed memory cell has any threshold voltage.

7. The memory system according to claim 1, wherein
   the successfully programmed memory cell has been programmed with a first number of programming pulses at being successfully programmed, and
   the first refreshing is performed with a second number of programming pulses, the second number being smaller than the first number.

8. The memory system according to claim 1, wherein
   the nonvolatile memory includes a plurality of word lines including a first word line, each of the word lines connecting at least one memory cell among the plurality of memory cells and being a unit for programming of data and a unit for reading of data, and
   the controller circuit is further configured to read data from the first word line, correct an error in the data, and control the nonvolatile memory to perform the first refreshing on the first word line with the data in which the error is corrected.

9. The memory system according to claim 1, wherein the nonvolatile memory is NAND flash memory.

10. The memory system according to claim 1, wherein the threshold voltage corresponds to number of electrons storable in a floating gate of the memory cell.

11. A memory system comprising:
    a nonvolatile memory including a plurality of blocks, each of the blocks including a plurality of word lines and being a unit for erasing of data, each of the word lines connecting a plurality of memory cells and being a unit for programming of data; and
    a controller circuit configured to:
    instruct the nonvolatile memory to program a plurality of first memory cells connected to a first word line included in a first block, wherein programming the first memory cells is repeated until a memory cell among the first memory cells is considered successfully programmed, and successfully programmed includes a threshold voltage of the memory cell becoming more than a predetermined verification voltage; and
    instruct the nonvolatile memory to perform first refreshing, the first refreshing including programming at least one memory cell among first memory cells that is considered successfully programmed at a time the performing the first refreshing is instructed.

12. The memory system according to claim 11, wherein the controller circuit is further configured to instruct the first refreshing on the at least one memory cell when the threshold voltage of the at least one memory cell is lower than a second voltage.

13. The memory system according to claim 11, wherein the controller circuit is further configured to instruct the nonvolatile memory to perform the first refreshing without erasing data from the at least one memory cell.

14. The memory system according to claim 11, wherein
    the first block further includes a second word line, and
    the first refreshing is performed on the first word line and is not performed on the second word line.

15. The memory system according to claim 11, wherein the controller circuit is further configured to determine the at least one memory cell on which the first refreshing is to be performed based on a location of error in data read from the first word line.

16. The memory system according to claim 11, wherein the controller circuit is further configured to determine the at least one memory cell on which the first refreshing is to be performed based on a distribution read performed on the first word line.

17. The memory system according to claim 11, wherein the memory cell has been successfully programmed with a first number of programming pulses at being programmed, and the first refreshing is performed with a second number of programming pulses, the second number being smaller than the first number.

18. The memory system according to claim 11, wherein each of the word lines is also a unit for reading of data, and the controller circuit is further configured to read data from the first word line, correct an error in the data, and instruct the nonvolatile memory to perform the first refreshing on the first word line with the data in which the error is corrected.

19. The memory system according to claim 11, wherein the nonvolatile memory is NAND flash memory.

20. The memory system according to claim 11, wherein the threshold voltage corresponds to number of electrons storable in a floating gate of the memory cell.

* * * * *